United States Patent

Kim et al.

[11] Patent Number: 5,944,580
[45] Date of Patent: Aug. 31, 1999

[54] SENSING DEVICE AND METHOD OF LEVELING A SEMICONDUCTOR WAFER

[75] Inventors: Yong-Kwon Kim, Cheongju; Jun-Yong Kim, Busan, both of Rep. of Korea

[73] Assignee: LG Semicon Co., Ltd., Cheongju, Rep. of Korea

[21] Appl. No.: 08/889,476

[22] Filed: Jul. 8, 1997

[30] Foreign Application Priority Data

Jul. 9, 1996 [KR] Rep. of Korea .................. 1996-27606

[51] Int. Cl.$^6$ .................................................. B24B 00/00
[52] U.S. Cl. ................................... 451/9; 451/5; 451/10; 451/41; 451/26; 451/288
[58] Field of Search .............................. 457/5, 9, 10, 41, 457/11, 26, 285–289; 156/345

[56] References Cited

U.S. PATENT DOCUMENTS 5,567,199  10/1996  Huber et al. ............................ 451/285
5,720,845  2/1998  Liu .......................................... 156/345
5,733,176  3/1998  Robinson et al. ....................... 451/41

Primary Examiner—Robert A. Rose
Assistant Examiner—George Nguyen
Attorney, Agent, or Firm—Fleshner & Kim

[57] ABSTRACT

An improved sensing device and method for leveling a semiconductor wafer in a chemical mechanical polishing apparatus, which easily detects the change of pressure from a semiconductor wafer contacting with the polishing surface. The present invention includes a polishing platen having a polishing pad on the upper leveled surface thereof, and fixed to a rotatable platen driving shaft. A carrier is rotatably provided on the upper surface of the polishing platen and holding the semiconductor wafer such that the lower surface of the semiconductor wafer is uniformly contacted with the polishing pad. A pressure detecting sensor senses the pressure applied from the semiconductor wafer on the polishing pad and outputs a corresponding signal.

28 Claims, 4 Drawing Sheets

SENSING DEVICE AND METHOD OF LEVELING A SEMICONDUCTOR WAFER

BACKGROUND OF THE INVENTION

1. Field of the Invention

The present invention relates to a sensing device, and more particularly, a sensing device and method of leveling a semiconductor wafer in a chemical mechanical polishing apparatus.

2. Background of the Related Art

Micro-electronic devices are formed in separate dies on a thin planar semiconductor wafer to fabricate a semiconductor device. On the semiconductor wafer, various conductive, insulative and semiconductive materials are used, and these materials are patterned, doped and deposited by many different types of processes, resulting in the formation of an integrated circuit (hereinafter, called "IC").

During fabrication of a semiconductor device, an oxide material 3 is formed on a thin planar substrate 1 of the semiconductor wafer, as shown in FIG. 1. IC devices 2 formed on the substrate 1 are exposed by removing the oxide material 3 down to the upper surface portion of the IC device using a process called chemical mechanical polishing planarization. FIG. 2 shows a semiconductor wafer after the chemical mechanical polishing planarization has been performed.

To planarize the semiconductor wafer 10, leveling of the polishing platen 11 and the semiconductor wafer 10 should be achieved in a CMP apparatus. As shown in FIG. 3, a level gauge 22 is put on the upper planar surface of the polishing platen 11 covered with a polishing pad 12 to level the surface of the semiconductor wafer 10 in the horizontal direction. To plumb level a carrier shaft 15 for holding the semiconductor wafer 10, a carrier head 16 is detached from the carrier shaft 15, and replaced with a pressure meter 24. Then, the carrier shaft 15 is lowered using a guide shaft 13 until the pressure meter 24 is contacted with the platen 11. The polishing platen 11 is rotated at a constant speed, and the carrier shaft 15 is also rotated by a motor 15a provided on an upper portion thereof.

Because the carrier shaft 15 can move in a vertical direction, some pressure is applied to the polishing pad 12 due to its own weight by gravity. The resultant pressure between the pressure meter 24 and the polishing pad 12 is measured on the pressure meter 24. When the values observed in the pressure meter 24 are not constant, the driving power is turned off and the apparatus must be manually re-adjusted and the above steps are repeated. Thus, when the measured value on the pressure meter 24 becomes regular, the leveling of the carrier shaft 15 is completed. At that time, the pressure meter 24 is detached therefrom, and the carrier shaft head 16 holding a semiconductor wafer 10 is replaced thereon to perform the polishing.

FIG. 4 shows the CMP apparatus after completing the leveling of the polishing platen 11 and the carrier shaft 15. A slurry is supplied through a slurry applicator 17 disposed above the polishing platen 11. As the polishing platen 11 is rotated at a regular speed, the carrier shaft 15 connected with a supporting arm 14 starts to rotate, and consequently a flatly-polished semiconductor wafer as shown in FIG. 2 is obtained.

As described above, the conventional CMP apparatus has various disadvantages. In order to perform the leveling, the carrier shaft head 16 must be separated and replaced with the pressure meter 24, which results in wasting much time in the preparation for performing the polishing operation. In addition, while the polishing process is being performed after the completion of the leveling of the polishing platen 11 and the carrier shaft 15, an observation cannot be made as to whether the polishing pad and the semiconductor wafer are maintained leveled with each other.

The above references are incorporated by reference herein where appropriate for appropriate teachings of additional or alternative details, features and/or technical background.

SUMMARY OF THE INVENTION

An object of the present invention is to solve the problems of the related art.

Another object of the present invention is to provide an improved sensing device and method for leveling for CMP apparatus.

Another object of the present invention is to easily sense changes in pressure due to a semiconductor wafer contacting surface of a polishing platen.

A further object of the present invention is to achieve reliability of the planarization process of the semiconductor wafer.

The present invention can be achieved in part or in whole by a sensing device for a chemical mechanical polishing (CMP) apparatus, comprising: a polishing platen having a polishing pad on an upper level surface thereof, and fixed to a rotatable platen driving shaft; a holding means rotatably provided on the upper surface of the polishing platen for holding a semiconductor wafer such that a lower surface of the semiconductor wafer is uniformly contacted with the polishing pad; and a sensing means for sensing pressure applied by the semiconductor wafer on the polishing pad and outputting a corresponding signal indicative of whether surfaces of the semiconductor wafer and the polishing pad are leveled with respect to one another.

To achieve the above object, there is provided a leveling sensing method for a CMP apparatus for a semiconductor device including contacting a semiconductor wafer held by a holding unit on an upper horizontal surface of a polishing platen, which is covered by a polishing pad, supplying a slurry on the polishing platen and simultaneously rotating the polishing platen and the holding unit, and sensing change of the pressure applied from the semiconductor wafer on the polishing pad and outputting a signal in accordance with the sensed pressure.

The present invention may be achieved in part or in whole by a device for detecting a pressure applied by a semiconductor on a polishing pad and a semiconductor wafer in a polishing apparatus used for planarizing the surface of the semiconductor wafer, comprising: a polishing platen, the polishing pad being placed on the polishing platen; a plurality of recesses formed in a surface of the polishing platen facing the polishing pad; and a plurality of sensors, corresponding sensors being placed in corresponding recesses and each sensor generating a signal indicative of the pressure between contacting surfaces of the semiconductor wafer and the polishing pad.

The present invention can also be achieved in part or in whole by a device for detecting a pressure applied by a semiconductor on a polishing pad and a semiconductor wafer in a polishing apparatus used for planarizing the surface of the semiconductor wafer, comprising: a carrier for retaining the semiconductor wafer; a plurality of recesses in a surface of said carrier, which faces a surface of the semiconductor wafer being retained by the carrier; and a plurality of sensors, corresponding sensors being placed in corresponding recesses and each sensor generating a signal indicative of the pressure between contacting surfaces of the semiconductor wafer and the polishing pad.

The objects, advantages and features may also be achieved in whole or in part by an apparatus for planarizing a first surface of a semiconductor wafer, comprising: a polishing platen; a polishing pad on a the rotatable polishing platen; means for applying slurry onto the polishing pad; means for holding the semiconductor wafer such that the first surface is in contact with the polishing pad during planarization; and means for sensing pressure between the first surface of the semiconductor wafer and a second surface of the polishing pad in contact with the first surface and outputting a signal indicative of whether the first and second surfaces are leveled with respect to each other, wherein said sensing means is located in at least one of the rotatable polishing platen and said holding means.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
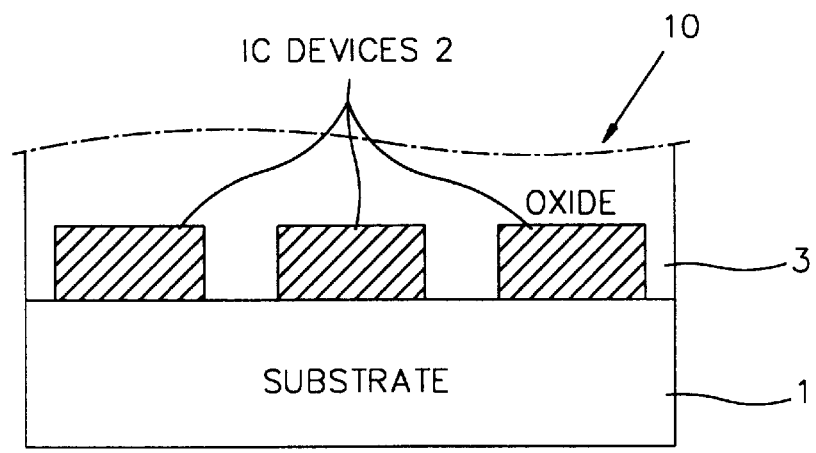
FIG. 1 is a cross-sectional view of a semiconductor wafer before polishing.
Figure 2:
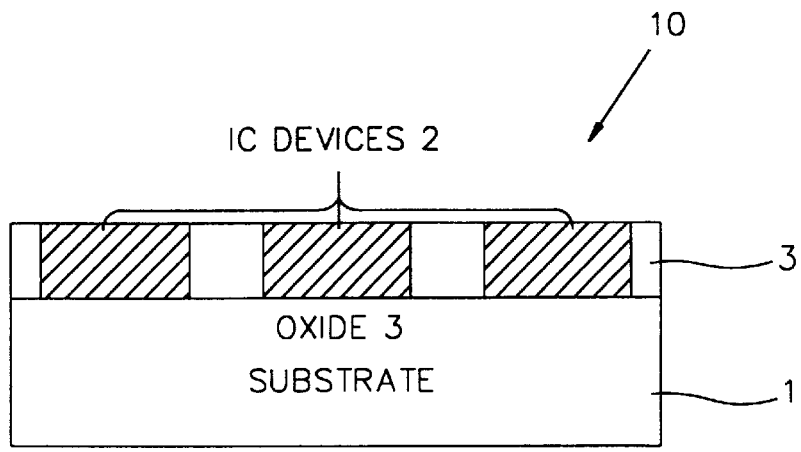
FIG. 2 is a cross-sectional view of the semiconductor wafer of FIG. 1 after polishing.
Figure 3:
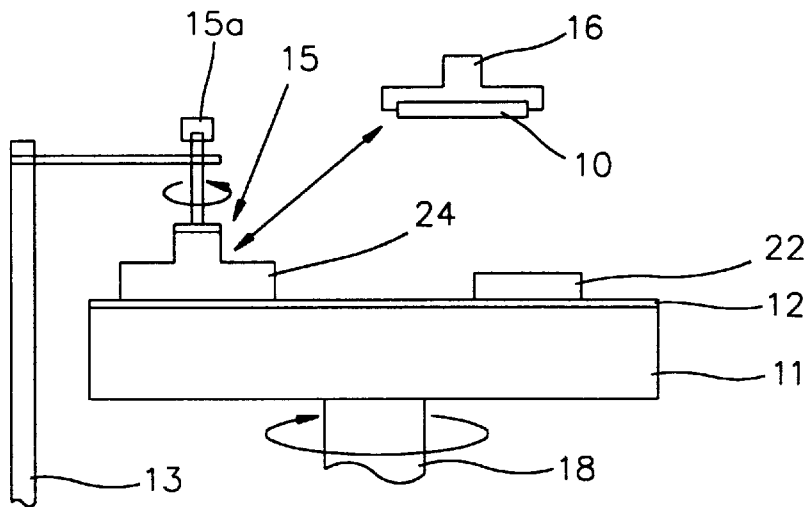
FIG. 3 is a view showing a leveling process of a polishing platen and a carrier shaft for a CMP apparatus according to the conventional art.
Figure 4:
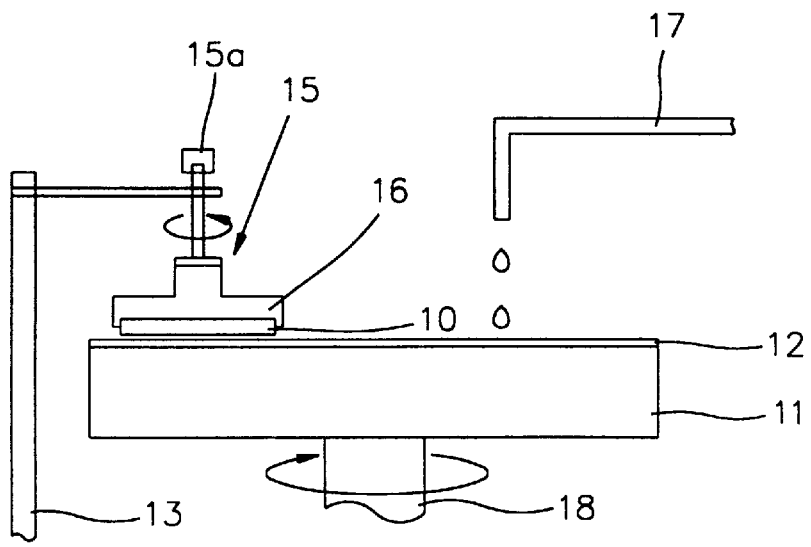
FIG. 4 is a view showing the CMP apparatus after completing the leveling of the polishing platen and carrier shaft.
Figure 5A:
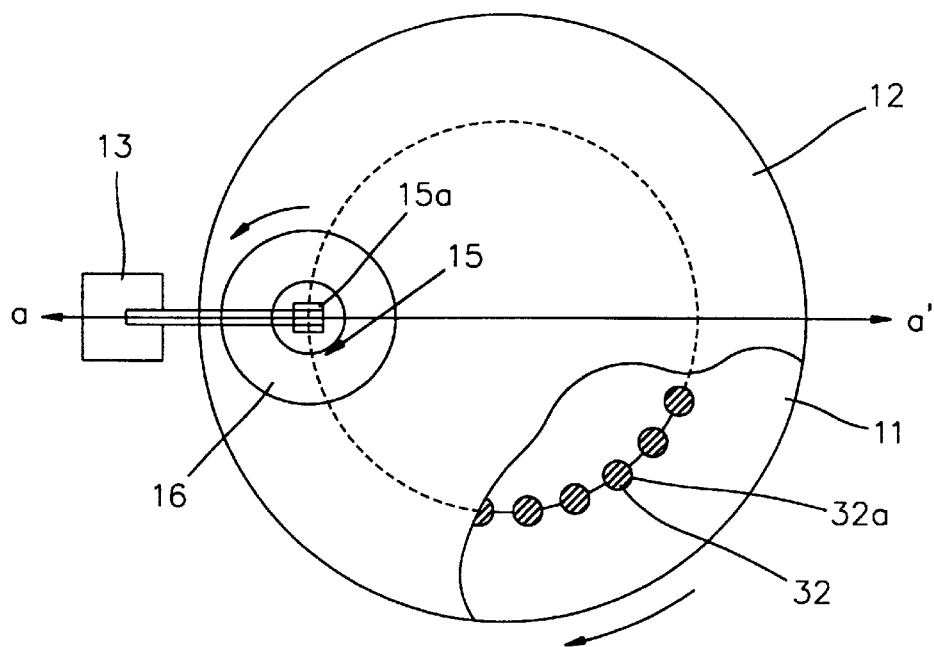
FIGS. 5A through 5B are views of a CMP apparatus incorporating a leveling sensing device according to the present invention.
Figure 5B:
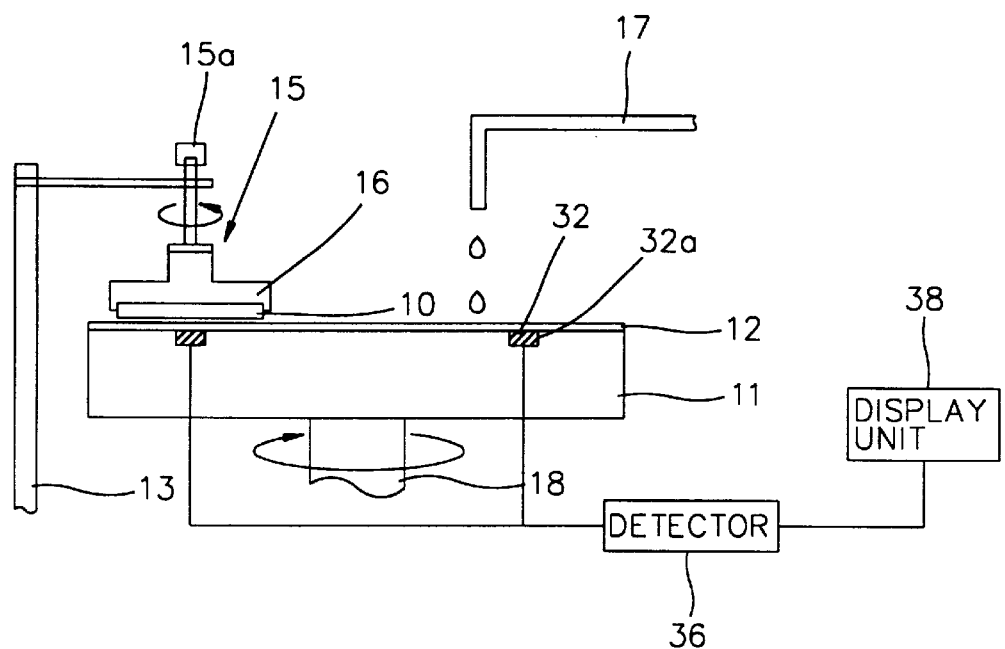

As shown in FIGS. 5A through 5B, a polishing apparatus having a leveling sensing device according to the present invention, which includes a polishing platen 11 for polishing a semiconductor wafer 10. The polishing platen 11 is covered on the upper horizontal surface thereof by a polishing pad 12, and is rotatable by a platen driving shaft 18.

Opposed to the upper portion of the polishing platen 11, a rotatable carrier 15 is provided for holding the semiconductor wafer 10 in a carrier head 16 thereof. The carrier 15 is vertically movable so that the carrier 15 can apply a downward pressure in accordance with its own weight by gravity. The surface of the semiconductor wafer 10 held in the carrier 15 contacts the surface of the polishing pad 12 on the polishing platen 11. Above the polishing platen 11, a slurry applicator 17 is disposed for supplying a slurry thereto.

In the upper surface of the polishing platen 11, a plurality of recesses 32a are formed at positions along a concentric circle, and pressure detecting sensors 32, such as piezoelectric sensors, are disposed in the plurality of recesses 32a, respectively. The pressure detecting sensors 32 sense the change of pressure applied from the semiconductor wafer 10 held by the carrier head 16 on the polishing platen 11, and output a signal corresponding to that pressure. Each pressure detecting sensor 32 is electrically connected with a detector 36, and the detector 36 is electrically connected to a display unit 38, as shown in FIG. 5B.

The center or central axis of semiconductor wafer 10 is aligned on a pressure detecting sensor 32, e.g., central axis on the polishing platen 11. When the polishing platen 11 is rotated, the plurality of pressure detecting sensors 32 pass under the center of the semiconductor wafer 10 to sense the pressure, as shown in FIG. 5A.

According to a first embodiment of the present invention for polishing the semiconductor wafer, a semiconductor wafer 10 is retained in the carrier head 16 to proceed with the leveling process. When power is supplied, the polishing platen 11 connected to the platen driving shaft 18 starts to rotate at a constant speed. A constant downward force is applied due to its own weight by gravity. The carrier head 16 can be rotated by the rotation of the platen 11. Thus, the semiconductor wafer 10 undergoes the effects of rotation and revolution on the polishing platen 11. Further, the carrier head 16 may be also rotated by the motor 15a. During this operation, a constant pressure is applied to the pressure detecting sensors 32 provided on the polishing platen 11 by the downward force, which the carrier 15 applies, and signals are outputted in accordance with the pressure.

The signals outputted from the pressure detecting sensors 32 are detected by the detector 36, and the detected signals are inputted to the display unit 38 to display a predetermined signal. According to the results displayed on the display unit 38, power is turned off manually or automatically to adjust the CMP apparatus. Afterwards, as power is applied again and the above process is repeated, without changing equipments, the carrier 15 having the semiconductor wafer 10 attached thereto is leveled.

The leveling sensing method for the CMP apparatus includes contacting the semiconductor wafer held by the carrier head 16 on the upper level surface of the polishing pad 16 on the polishing platen 11, supplying a slurry on the polishing platen 11 and simultaneously rotating the polishing platen 11 and the holding unit (15 and 16), and sensing the change of the pressure applied from the semiconductor wafer 10 on the polishing pad 12 and outputting the sensed signal in accordance with the pressure.

Figure 6:
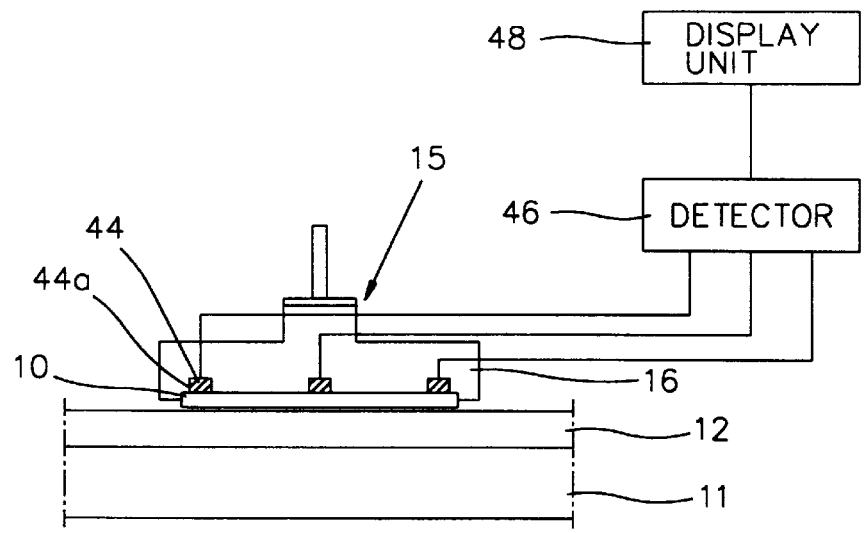
FIG. 6 is a schematic view of another embodiment of a leveling sensing device for a CMP apparatus according to the present invention.

FIG. 6 illustrates another embodiment of a CMP apparatus employing a leveling sensing device and method of the present invention. In a lower portion of the carrier head 16 for holding the semiconductor wafer 10, a plurality of recesses 44a are formed, preferably in the center and a concentric circle. A pressure detecting sensor 44 is disposed as a detecting unit. Each pressure detecting sensor 44 is electrically connected to a detector 46, respectively, and the detector 46 is electrically connected to a display unit 48. The leveling sensing method of the carrier for the planarization of the semiconductor wafer is identical to the first embodiment of the present invention.

The leveling sensing device and method for the CMP apparatus according to the second embodiment of the present invention has the effect that the preparation time for carrying out the operation is shortened since the semiconductor wafer can be leveled by a sensing unit without the necessity for disposing a separate equipment for leveling. Furthermore, the leveled condition of the polishing pad and the semiconductor wafer can be observed by means of a sensing unit and adjusted during the polishing process, resulting in achieving reliability of the planarization process of the semiconductor wafer. Moreover, the sensing unit can be desirably utilized as a detecting apparatus for completing a planarization process of the semiconductor wafer.

Figure 7:
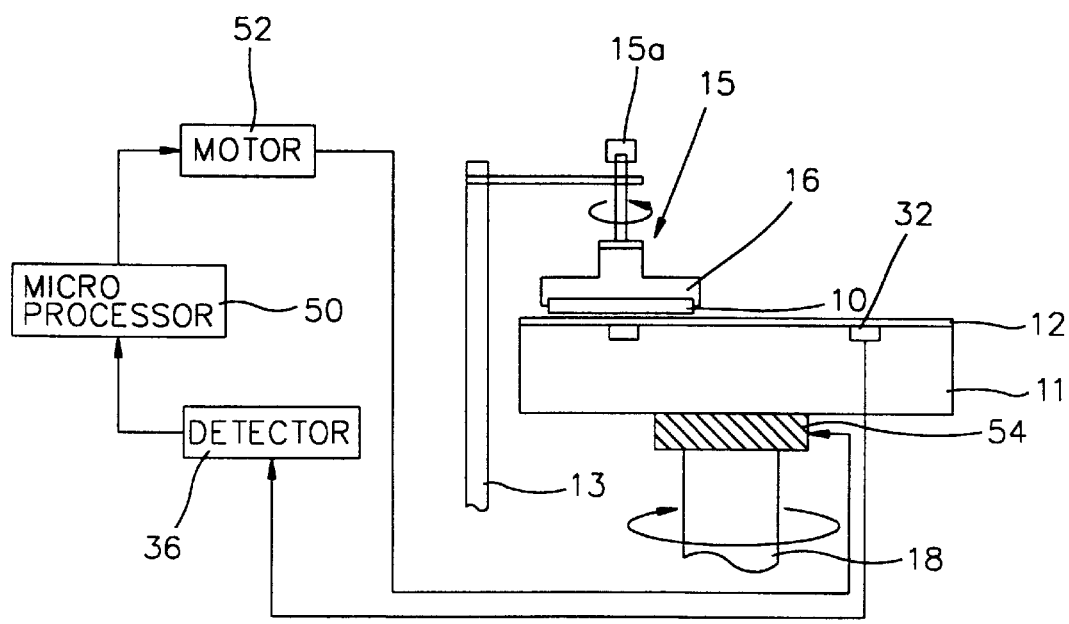
FIG. 7 is a schematic view of another embodiment of the present invention.

FIG. 7 illustrates another embodiment of the present invention. The FIG. 7 embodiment is similar to the FIG. 5 embodiment, and also includes a microprocessor 50, a motor 52 and a pivoting mechanism. The detector 36 detects the signals generated by the plurality of pressure sensing sensors 32. The detected signals are inputted to the micrprocessor 50, which determines whether there is a difference, e.g., voltage differences, between the detected signals. Based on the signal difference, the microprocessor 50 controls the activation of a motor to move the platen 11 in X, Y, and Z axis using the pivoting mechanism 54. This modification is also applicable to the FIG. 6 embodiment by placing the pivoting mechanism on the connection between the shaft coupling the carrier head 16. Alternatively, the above two modification can be incorporated together.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A sensing device for a chemical mechanical polishing (CMP) apparatus, comprising:

a polishing platen having a polishing pad on an upper level surface thereof, and fixed to a rotatable platen driving shaft;

a holding means rotatably provided on the upper surface of the polishing platen for holding a semiconductor wafer such that a lower surface of the semiconductor wafer contacts with the polishing pad; and a sensing means for sensing pressure applied by the semiconductor wafer on the polishing pad and outputting a corresponding signal indicative of whether surfaces of said semiconductor wafer and said polishing pad are leveled with respect to one another.

2. The leveling sensing device of claim 1, wherein said sensing means includes a plurality of recesses formed in a concentric circle in the upper leveled surface of the polishing platen, and in each of the plurality of recesses is provided a pressure detecting sensor is provided in each of said plurality of recesses.

3. The leveling sensing device of claim 2, wherein a center of the semiconductor wafer is positioned over the pressure detecting sensor of the polishing platen.

4. The leveling sensing device of claim 1, wherein said holding means includes a carrier head for holding the semiconductor wafer and having a lower surface; and said sensing means includes a plurality of recesses formed on the lower surface of said carrier head with a pressure detecting sensor being disposed in each recess.

5. The leveling sensing device of claim 4, wherein the recesses are formed at a center of the lower surface of the carrier head and positioned in a concentric circle from the center of the carrier head.

6. A leveling sensing method for a CMP apparatus for a semiconductor wafer, comprising:

contacting a semiconductor wafer held by a holding unit on an upper horizontal surface of a polishing platen, which is covered by a polishing pad;

supplying a slurry on the polishing platen and simultaneously rotating the polishing platen and the holding unit; and sensing a change of the pressure applied from the semiconductor wafer on the polishing pad and outputting a signal in accordance with the sensed pressure.

7. A device for detecting a pressure applied by a semiconductor on a polishing pad and a semiconductor wafer in a polishing apparatus used for planarizing the surface of the semiconductor wafer, comprising:

a polishing platen, the polishing pad being placed on said polishing platen;

a plurality of recesses formed in a surface of said polishing platen facing the polishing pad; and a plurality of sensors, corresponding sensors being placed in corresponding recesses and each sensor generating a signal indicative of the pressure between contacting surfaces of the semiconductor wafer and the polishing pad.

8. The device of claim 7, wherein the signal indicative of the pressure indicates whether surfaces of the semiconductor wafer and polishing pad are leveled with respect to each other in a prescribed alignment.

9. The device of claim 8, wherein the prescribed alignment is a horizontal alignment.

10. The device of claim 8, wherein said plurality of recesses are placed in a circular arrangement in said polishing platen.

11. The device of claim 10, wherein each recess is aligned with a central axis of the semiconductor wafer as the polishing platen is rotated.

12. The device of claim 11, wherein a central axis of each recess is aligned with the central axis of the semiconductor wafer.

13. A device for detecting a pressure applied by a semiconductor on a polishing pad and a semiconductor wafer in a polishing apparatus used for planarizing the surface of the semiconductor wafer, comprising:

a carrier for retaining the semiconductor wafer;

a plurality of recesses in a surface of said carrier, which faces a surface of the semiconductor wafer being retained by said carrier; and a plurality of sensors, corresponding sensors being placed in corresponding recesses and each sensor generating a signal indicative of the pressure between contacting surfaces of the semiconductor wafer and the polishing pad, wherein the signal indicative of the pressure indicates whether surfaces of the semiconductor wafer and polishing pad are leveled with respect to each other in a prescribed alignment.

14. The device of claim 13, wherein the prescribed alignment is a horizontal alignment.

15. The device of claim 13, wherein said plurality of recesses are placed in a circular arrangement in said carrier.

16. The device of claim 10, wherein said plurality of recesses includes a recess located in a central location from said recesses placed in a circular arrangement of said carrier.

17. An apparatus for planarizing a first surface of a semiconductor wafer, comprising:

a polishing platen;

a polishing pad on a said polishing platen;

means for applying slurry onto the polishing pad;

means for holding the semiconductor wafer such that the first surface is in contact with the polishing pad during planarization; and means for sensing pressure between the first surface of the semiconductor wafer and a second surface of the polishing pad in contact with the first surface and outputting a signal indicative of whether the first and second surfaces are leveled with respect to each other, wherein said sensing means is located in at least one of said polishing platen and said holding means.

18. The apparatus of claim 17, further comprising a first shaft for driving said polishing platen in a rotational direction.

19. The apparatus of claim 17, wherein said holding means includes a carrier head to retain the semiconductor wafer.

20. The apparatus of claim 19, wherein said holding means further comprises a motor;

a second shaft coupling the motor to said carrier head;

a support shaft coupled to the second shaft; and a third shaft coupled to the support shaft for allowing movement of the carrier head in a direction perpendicular to the first and second surfaces.

21. The apparatus of claim 19, wherein said sensing means comprises:

a plurality of recesses formed in surface of said carrier head which faces the semiconductor wafer; and a plurality of sensors, corresponding sensors being placed in corresponding recesses and each sensor generating a signal indicative of the pressure between the first and second surfaces of the semiconductor wafer and the polishing pad, respectively.

22. The apparatus of claim 21, wherein said plurality of recesses are placed in a circular arrangement in said carrier.

23. The apparatus of claim 22, wherein said plurality of recesses includes a recess located in a central location from said recesses placed in the circular arrangement of said carrier.

24. The apparatus of claim 19, wherein said sensing means comprises:

a plurality of recess formed in a surface of said polishing platen facing the polishing pad; and a plurality of sensors, corresponding sensors being placed in corresponding recesses and each sensor generating a signal indicative of the pressure between the first and second surfaces of the semiconductor wafer and the polishing pad, respectively.

25. The apparatus of claim 24, wherein said plurality of recesses are placed in a circular arrangement in said polishing platen.

26. The apparatus of claim 25, wherein each recess is aligned with a central axis of the semiconductor wafer as the polishing platen is rotated.

27. The apparatus of claim 11, wherein a central axis of each recess is aligned with the central axis of the semiconductor wafer.

28. The apparatus of claim 17 further comprising:

a pivoting mechanism that pivots said polishing platen in at least one of X, Y and Z direction;

a motor that enables said pivoting mechanism to move said polishing platen in at least one of X, Y and Z direction; and a detector coupled to said pressure sensing means to detect a signal; and a microprocessor activating said motor based on the detected signal.

* * * * *